US010651101B2

(12) United States Patent
Sorrieul

(10) Patent No.: US 10,651,101 B2
(45) Date of Patent: May 12, 2020

(54) ELECTRONIC PACKAGE WITH A LOCAL SLOT FORMING AN AIR-VENT

(71) Applicant: STMicroelectronics (Grenoble 2) SAS, Grenoble (FR)

(72) Inventor: Marika Sorrieul, Montaud (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 81 days.

(21) Appl. No.: 15/978,439

(22) Filed: May 14, 2018

(65) Prior Publication Data

US 2018/0337104 A1 Nov. 22, 2018

(30) Foreign Application Priority Data

May 16, 2017 (FR) ...................................... 17 54298

(51) Int. Cl.
| | |
|---|---|
| *H01L 23/055* | (2006.01) |
| *H01L 23/00* | (2006.01) |
| *H01L 33/48* | (2010.01) |
| *H01L 31/0203* | (2014.01) |
| *H01L 23/04* | (2006.01) |
| *G01S 17/02* | (2020.01) |
| *H01L 23/10* | (2006.01) |

(Continued)

(52) U.S. Cl.
CPC .......... *H01L 23/055* (2013.01); *G01S 7/4813* (2013.01); *G01S 17/026* (2013.01); *H01L 23/04* (2013.01); *H01L 23/10* (2013.01); *H01L 23/562* (2013.01); *H01L 31/0203* (2013.01); *H01L 31/16* (2013.01); *H01L 33/483* (2013.01); *H01L 25/167* (2013.01)

(58) Field of Classification Search
CPC .. H01L 23/055; H01L 23/562; H01L 31/0203
See application file for complete search history.

(56) References Cited

U.S. PATENT DOCUMENTS

| | | | | |
|---|---|---|---|---|
| 4,229,758 A | * | 10/1980 | Ikari ..................... | H01L 23/057 |
| | | | | 174/536 |
| 4,975,762 A | * | 12/1990 | Stradley ................ | H01L 23/556 |
| | | | | 257/660 |

(Continued)

FOREIGN PATENT DOCUMENTS

| | | | | | |
|---|---|---|---|---|---|
| EP | 2325600 A1 | * | 5/2011 | ........... | G01S 7/4813 |
| GB | 2505675 A | * | 3/2014 | ........... | H01L 23/055 |

(Continued)

OTHER PUBLICATIONS

INPI Search Report and Written Opinion for FR 1754298 dated Feb. 7, 2018 (8 pages).

*Primary Examiner* — Earl N Taylor
(74) *Attorney, Agent, or Firm* — Crowe & Dunlevy

(57) ABSTRACT

A support plate has a front face with an electronic chip mounted on the front face. A cover for encapsulating the electronic chip includes a front wall extending in front of the electronic chip and a peripheral wall having an end edge fixed on a peripheral area of the support plate. The support plate and the encapsulating cover define a chamber in which the electronic chip is located. A local slot is arranged to extend between the peripheral wall of the encapsulating cover and the support plate. The local slot has an exterior opening and an interior opening leading into said chamber.

38 Claims, 2 Drawing Sheets

(51) Int. Cl.
    *G01S 7/481*     (2006.01)
    *H01L 31/16*     (2006.01)
    *H01L 25/16*     (2006.01)

(56) References Cited

U.S. PATENT DOCUMENTS

| | | | | |
|---|---|---|---|---|
| 5,023,398 | A * | 6/1991 | Mahulikar | H01L 23/057 174/529 |
| 5,317,107 | A * | 5/1994 | Osorio | H01L 23/047 174/377 |
| 5,635,754 | A * | 6/1997 | Strobel | H01L 23/055 257/659 |
| 5,898,909 | A * | 4/1999 | Yoshihara | H01L 23/552 257/E23.114 |
| 5,990,418 | A * | 11/1999 | Bivona | H01L 23/16 174/546 |
| 6,300,673 | B1 * | 10/2001 | Hoffman | H01L 23/057 257/666 |
| 6,740,959 | B2 * | 5/2004 | Alcoe | H01L 23/552 257/659 |
| 6,844,562 | B2 * | 1/2005 | Takaoka | G01O 25/00 250/201.6 |
| 7,148,084 | B2 * | 12/2006 | Strobel | H01L 23/055 438/115 |
| 7,888,797 | B2 * | 2/2011 | Takagi | H01L 23/047 257/728 |
| 8,748,856 | B2 * | 6/2014 | Campbell | H01L 27/14618 250/221 |
| 8,780,330 | B2 * | 7/2014 | Wada | G01C 3/085 356/4.01 |
| 10,131,538 | B2 * | 11/2018 | Kaanta | B81B 7/0048 |
| 2001/0013640 | A1 * | 8/2001 | Tao | H01L 23/04 257/667 |
| 2005/0029534 | A1 * | 2/2005 | Ochiai | H01L 23/055 257/99 |
| 2005/0035896 | A1 * | 2/2005 | Fujieda | B82Y 10/00 342/1 |
| 2005/0104792 | A1 * | 5/2005 | Asao | H01Q 13/10 343/767 |
| 2005/0247992 | A1 * | 11/2005 | Tsukamoto | H01L 27/14618 257/433 |
| 2006/0086911 | A1 * | 4/2006 | Charrier | G08B 13/183 250/556 |
| 2006/0139903 | A1 * | 6/2006 | Takagi | H01L 23/047 361/764 |
| 2007/0284714 | A1 * | 12/2007 | Sakakibara | H01L 23/055 257/680 |
| 2010/0117181 | A1 * | 5/2010 | Kim | H01L 27/14618 257/432 |
| 2011/0057129 | A1 * | 3/2011 | Yao | G01S 7/4813 250/552 |
| 2011/0121181 | A1 * | 5/2011 | Costello | G01S 7/4813 250/338.1 |
| 2012/0160994 | A1 * | 6/2012 | Costello | G01D 11/245 250/221 |
| 2013/0299683 | A1 * | 11/2013 | Tamura | H01L 31/02327 250/216 |
| 2014/0061447 | A1 * | 3/2014 | Campbell | G01S 7/4813 250/221 |
| 2018/0337104 | A1 * | 11/2018 | Sorrieul | H01L 23/055 |

FOREIGN PATENT DOCUMENTS

| | | | |
|---|---|---|---|
| GB | 2505675 A | 3/2014 | |
| KR | 20050014674 A * | 2/2005 | ........... H01L 23/055 |
| WO | WO-2005109528 A1 * | 11/2005 | ........... H01L 23/055 |

* cited by examiner

ELECTRONIC PACKAGE WITH A LOCAL SLOT FORMING AN AIR-VENT

PRIORITY CLAIM

This application claims the priority benefit of French Application for Patent No. 1754298, filed on May 16, 2017, the disclosure of which is hereby incorporated by reference in its entirety to the maximum extent allowable by law.

TECHNICAL FIELD

Embodiments relate to the field of packages, in particular those intended to contain electronic chips, that can, for example, be called "electronic packages".

SUMMARY

According to an embodiment, a package comprises a support plate having a front face; at least one electronic chip mounted on the front face of the support plate; and a cover for encapsulating the electronic chip, comprising a front wall extending in front of the electronic chip and a peripheral wall having an end edge fixed on a peripheral area of the support plate, the support plate and the encapsulating cover defining at least one chamber in which the electronic chip is located.

At least one local slot is arranged between the peripheral wall of the encapsulating cover and the support plate and has an exterior opening and an interior opening leading into said chamber, such as to connect said chamber and the exterior.

Thus, said local slot makes it possible to prevent an excess pressure of gas in said chamber.

A fixing glue bead can be inserted between the end edge of the peripheral wall of the encapsulating cover and said peripheral area of the support plate, this bead having a local break including said local slot.

Said local slot can include a local groove arranged in the support plate and/or a groove arranged in the end edge of the peripheral wall of the encapsulating cover.

At least one interior divider can be provided, this divider being located between the chip and the interior opening of said local slot.

Said divider can form an at-least-partial obstacle to the diffusion, in the chamber, of the light coming from the local slot.

Said divider can be provided such as to project from the front face of the support plate.

Said divider can have ends attached at two spaced-apart sites of the peripheral wall of the encapsulating cover, these two spaced-apart sites being located on either side of said local slot.

The front edge of said divider can be located in front of the front edge of said local slot.

Said divider can comprise a glue bead extending over the front face of the support plate.

Said chip can be provided, in the front face thereof, with at least one optical sensor, the front wall of the encapsulating cover having at least one through-hole and being provided with an optical element obstructing this hole and transmitting light.

Said divider can then form an at-least-partial obstacle to the diffusion, in said chamber, of the light possibly coming from the local slot toward said optical sensor.

Said chip can be provided, in the front face thereof, with two optical sensors, said encapsulating cover being provided with a separating internal partition defining two cavities in said chamber, inside which said sensors are located; a chip provided with a light radiation emitter can be placed in one of said cavities; and said front wall of the encapsulating cover can have through-holes located on either side of the internal partition and can be provided with optical elements obstructing these holes, respectively, and transmitting light.

BRIEF DESCRIPTION OF THE DRAWINGS

A package will now be described by way of non-limiting example, illustrated by the drawings, wherein.

DETAILED DESCRIPTION

Figure 1:
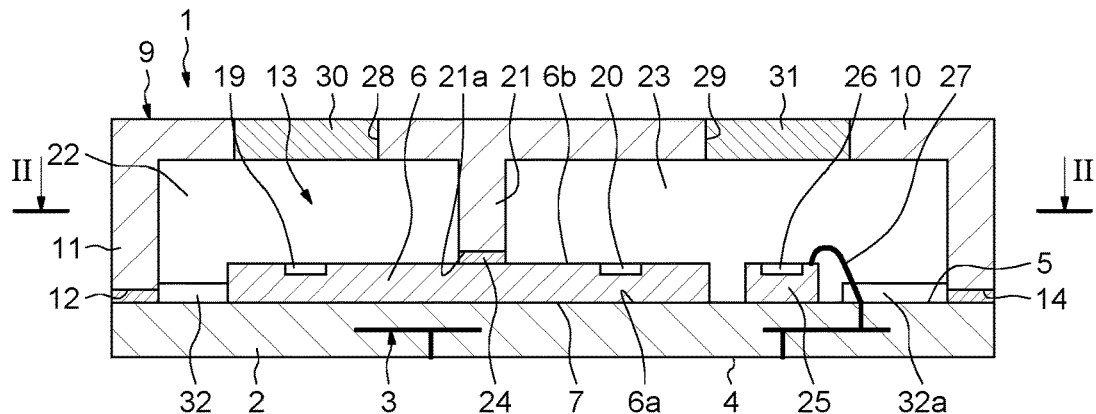
FIG. 1 shows a longitudinal mid-section of a package, in a perpendicular manner to a support plate, along I-I of FIG. 2.
Figure 2:
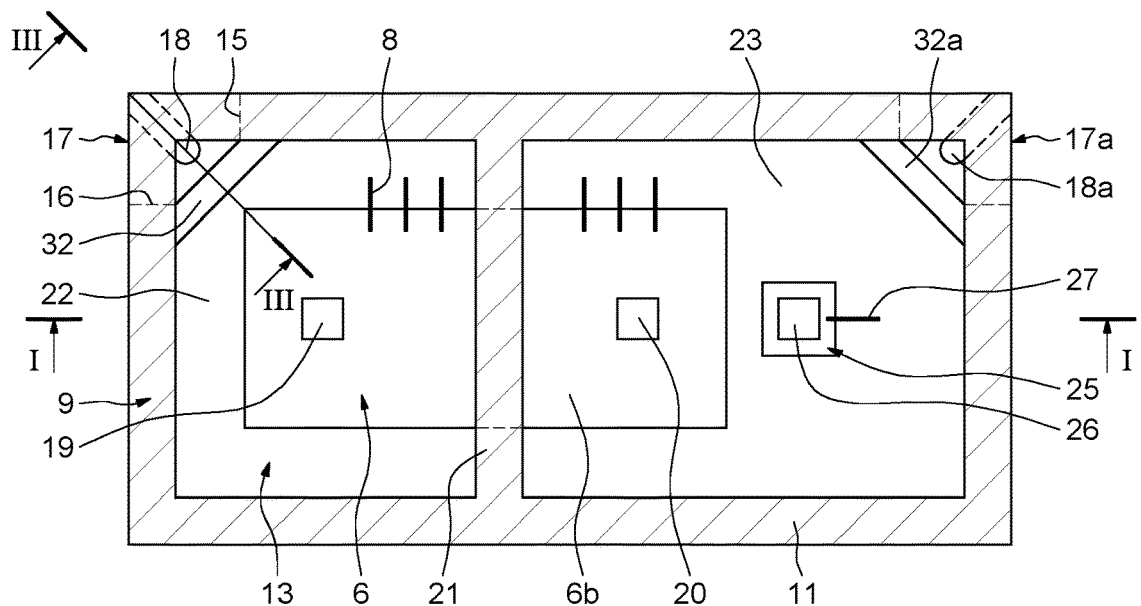
FIG. 2 shows a flat section of the package of FIG. 1, in a parallel manner to the support plate, along II-II of FIG. 1.
Figure 3:
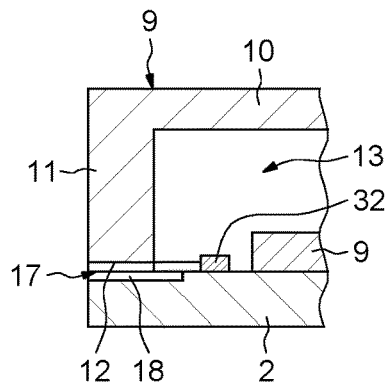
FIG. 3 shows a local section of a corner of the package, in a perpendicular manner to the support plate, along III-III of FIG. 2.

FIGS. 1-3 illustrate a package 1 which comprises a support plate 2, made from a dielectric material, including an integrated network of electrical connections 3 and having a rear face 4 and a mounting front face 5. The outline of the support plate 2 is, for example, square or rectangular.

The package 1 comprises an electronic chip (i.e., an integrated circuit die) 6 mounted above the front face 5 of the support plate 2, by means of a glue layer 7 inserted between the front face 5 of the support plate 2 and a rear face 6a of the chip 6. The circumference of the electronic chip 6 is at a distance from the periphery of the support plate 2.

The chip 6 is electrically connected to the network of connections 3 by means of electrical connection wires 8, referred to in the art as bonding wires, connecting electrical pads of the front face 5 of the support plate 2 and electrical pads of the front face 6b of the chip 6, the rear face 4 of the support plate 2 being provided with electrical connection pads (not shown) for exterior electrical connections of the network of connections 3.

The package 1 comprises a cover 9 for encapsulating the chip 6 and the electrical connection wires 8 in front of the support plate 2.

The encapsulating cover 9 is shaped like a bowl and comprises a front wall 10 located above and at a distance from the chip 6, in a parallel manner to the support plate 2, and a peripheral wall 11 which extends rearward from the front wall 10, wherein the end edge 12 of the wall 11 is adjacent to a peripheral area of the front face of the support plate 2. The outline of the peripheral wall 11 corresponds substantially to outline or perimeter of the support plate 2.

Thus, the support plate 2 and the encapsulating cover 9 define a chamber 13 inside which the chip 6 and the wires 8 are located.

The encapsulating cover 9 is fixed on the support plate 2 by means of a glue bead 14 inserted between the end edge 12 of the peripheral wall 11 and the peripheral area of the front face 5 of the support plate 2.

The glue bead 14 is broken, for example, in the proximity of a corner of the support plate 2 and has ends 15 and 16 located at a distance from one another, such as to arrange a local through-slot 17, free of glue, between a local area of the support plate and a local area of the end edge 12 of the peripheral wall 11 of the encapsulating cover 9.

The local slot 17 has an interior opening and an exterior opening, such that the local slot 17 leads firstly into the chamber 13 and secondly towards the exterior and establishes a connection between the interior chamber 13 and the exterior, forming an air-vent.

Thus, the local slot 17 makes it possible to prevent any excess pressure of gas in the chamber 13, which is closed everywhere else, or in a chamber 13 part that is also closed, into which the local slot 17 leads.

The package 1 can be subjected to temperature increases, producing increases in the temperature of the gas contained in the chamber 13, in particular during the hardening of the glue bead 14, which can cause degassing, during the fixing of additional elements on the package 14 by means of a glue or during the mounting of the package on a printed circuit board by means of soldering for fixing and for electrical connection between the rear face 4 and this printed circuit board.

The local slot 17 makes it possible to prevent increases in the temperature of the gas from becoming excess pressures in the chamber 13 which could create forces tearing off the encapsulating cover 9 with respect to the support plate 2, which could partially destroy, in the form of cracking, or totally destroy the bond via a continuous glue bead 14.

The local slot 17 includes an enlargement local groove 18 arranged in the front face 5 of the support plate 2 and extending to a certain depth into the support plate 2. The local groove 17 extends from the edge of the support plate 2 up to a site located in the chamber 13, slightly beyond the interior face of the peripheral wall 11 of the encapsulating cover 9.

The local slot 17 could, additionally or alternatively, include a through-groove arranged in the end edge 12 of the peripheral wall 11 of the encapsulating cover 9. Such an additional or alternative through-groove would, in a manner similar to that with the groove 18, extend to a certain depth into the end edge 12.

The chip 6 could be any chip. Nevertheless, according to the example shown, the chip 6 comprises, in the front face thereof 6b, light radiation sensors 19 and 20 which are spaced apart from each other longitudinally.

The encapsulating cover 9 comprises a separating internal protuberance 21, projecting from the front wall 10 and joining two opposite sides of the peripheral wall 11.

The separating internal protuberance 21 forms a partition which divides the chamber 13 into two cavities 22 and 23 and straddles the chip 6, at a site such that the sensors 19 and 20 are located on each side, respectively, and at a distance from the internal protuberance 21, inside the cavities 22 and 23.

The separating internal protuberance 21 has a rear edge 21a provided with a cut-out through which the chip 6 passes, this rear edge 21a being fixed firstly on areas of the front face 5 of the support plate 2, which areas are located on either side of the chip 6, and secondly on areas of the front face 6a and of the flanks of the chip 6, by means of a glue bead 24. Thus, the separating internal protuberance 21 forms a partition which divides the chamber 13 into two cavities 22 and 23 that are optically separated.

An electronic chip (integrated circuit die, for example) 25 is installed inside the cavity 23, which chip is glued onto the front face 5 of the support plate 2, beside the chip 6. The chip 25 comprises, in the front face thereof 25a, a light radiation emitter 26 and is connected to the network of electrical connections 3 by electrical connection wires 27.

The support plate 2, the encapsulating cover 9, the glue bead 14 and the glue bead 24 are made of opaque materials.

The front wall 10 of the encapsulating cover 9 has through-holes 28 and 29 which are filled by light-transmitting optical elements 30 and 31, which are associated with the cavities 22 and 23, respectively. The optical elements 30 and 31 can be attached by gluing on a cover 9, which is prefabricated, or be inserted by over-molding the cover 9.

The emitter 26 of the chip 25 emits light radiation, for example in the infrared spectrum, towards the exterior through the optical element 31. This light radiation present in the cavity 23 is picked up by the sensor 20 of the chip 6. The sensor 19 of the chip 6 picks up the exterior light radiation through the optical element 30 which can be an infrared filter which can form an optical lens for focusing the light towards the sensor 19. The electronic package 1 can form a means for detecting proximity of a body by processing the signals coming from the sensors 19 and 20 (for example through the use of time of flight (ToF) techniques known to those skilled in the art).

The local slot 17 leads into the cavity 22.

Since the interior opening of the local slot 17 is small, the light which could enter the cavity 22 via this local slot 17 cannot significantly interfere with the light picked up by the sensor 19 as described above.

Nevertheless, the package 1 can comprise an interior light barrier 32 which is located between the chip 6 and the interior opening of the local slot 17 and which forms an at-least-partial obstacle to the diffusion, in the cavity 22, of the light possibly coming from the local slot 17 in the direction of the sensor 19.

The material forming the light barrier 32 has a low transmittance at the wavelengths to which the optical sensor 19 is sensitive. The absorptions by the divider and by the walls of the chamber 13 contribute to a strong attenuation of the light coming from the local slot 17.

As indicated above, the existence of the local slot 17 makes it possible to prevent the formation of cracks in the glue bead 14, which could transmit light and interfere with the light signal detected by the optical sensor 19.

Advantageously, the interior light barrier 32 is located in proximity to the interior opening of the local slot 17.

According to the exemplary embodiment shown, the interior light barrier 32 projects from the front face of the support plate 2.

The interior light barrier 32 has ends attached at two spaced-apart sites of the peripheral wall 11 of the encapsulating cover 9, these two spaced-apart sites being located on either side of the local slot 17.

The height of the interior light barrier 32 is such that the front edge or top thereof is located in front of the end edge of said local slot 17, i.e. in front of the front edge 12 of the peripheral wall 11 of the encapsulating cover 9.

Advantageously, the interior light barrier 32 is formed by a glue bead which is extended over the front face 5 of the support plate 2 and which meets portions of the glue bead 14, which are adjacent to the ends 15 and 16 of this glue bead 14. Indeed, a common glue deposit may be used to form the glue bead 14 and light barrier 32.

In an equivalent manner, to connect the cavity 23 with the exterior, a local slot 17a forming an air-vent is arranged and corresponds to a break in the glue bead 14 in a corresponding corner, between spaced ends 15a and 16a of this bead 14, this local slot 17a including a local groove 18a. An internal light barrier 32a of glue is also arranged in proximity to the interior opening of the local slot 17a. Again, the common glue deposit may be used to form the glue bead 14 and light barrier 32a.

The encapsulating cover 9 can be mounted on the support plate 2 in the following manner.

Figure 4:
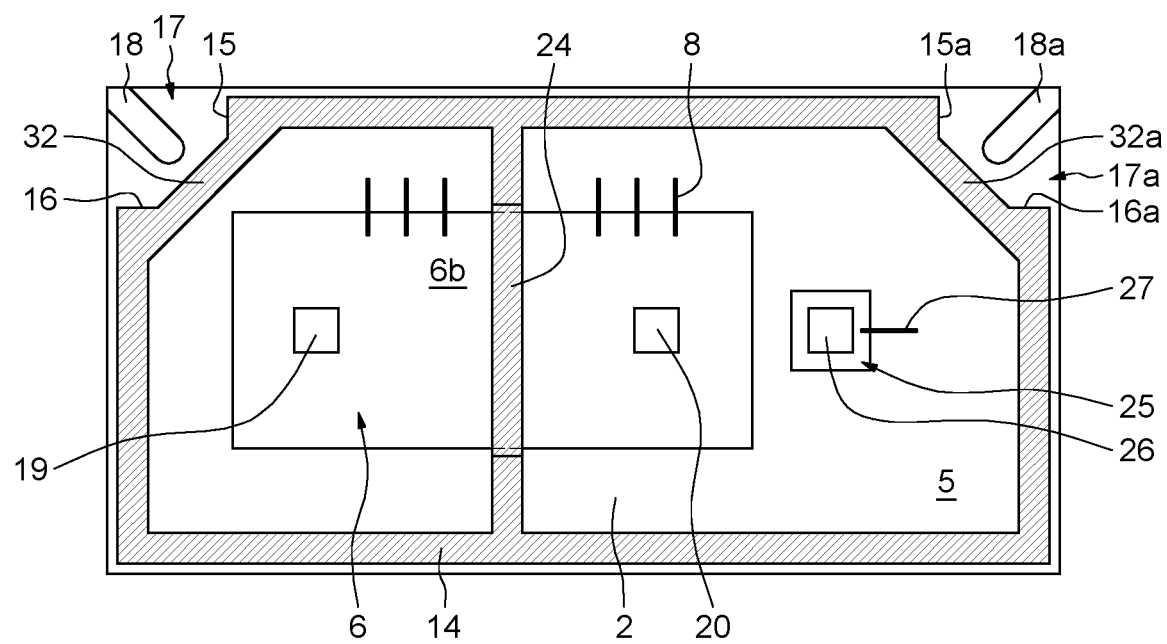
FIG. 4 shows a top view of the support plate, before assembly.

As illustrated in FIG. 4, glue beads are extended which are suitable for forming the glue bead 14, the dividers 32 and 32a and the glue bead 24. This operation can be carried out using a gun, the movement and the flow rate of which are controlled.

Then, the encapsulating cover 9 is put in place above the support plate 2, in the position described above, and the glue is hardened such as to form the glue beads 14 and 24, which are squashed, whereas the glue beads forming the dividers 32 and 32a remain intact and have a thickness greater than that of the glue bead 14.

According to an alternative embodiment, the internal divider could be formed by an internal partition of the encapsulating cover 9, projecting from the front wall 10, the end edge of this internal partition being locally stuck to the front face 5 of the support plate 2, with the provision of a local space between the end edge of this internal partition and the front face 5 of the support plate 2.

The invention claimed is:

1. A package, comprising:
   a support plate having a front face;
   at least one electronic chip mounted on the front face of the support plate;
   a cover which encapsulates the at least one electronic chip, said cover comprising a front wall extending in front of the at least one electronic chip and a peripheral wall having an end edge fixed on a peripheral area of the support plate, wherein the support plate and the cover define a chamber in which the at least one electronic chip is located;
   at least one local slot arranged between the peripheral wall of the cover and the support plate and having an exterior opening and an interior opening leading into said chamber, said at least one local slot connecting said chamber and an exterior; and
   a fixing glue bead inserted between the end edge of the peripheral wall of the cover and said peripheral area of the support plate, wherein the fixing glue bead has a local break including said at least one local slot.

2. The package according to claim 1, wherein said at least one local slot includes a local groove arranged in the front face of the support plate.

3. The package according to claim 1, wherein said at least one local slot includes a local groove arranged in the end edge of the peripheral wall of the cover.

4. The package according to claim 1, further comprising at least one interior divider located between the at least one electronic chip and the interior opening of said at least one local slot.

5. The package according to claim 4, wherein said at least one interior divider projects from the front face of the support plate.

6. The package according to claim 4, wherein said at least one interior divider has ends attached at two spaced-apart sites of the peripheral wall of the cover, these two spaced-apart sites being located on either side of said at least one local slot.

7. The package according to claim 4, wherein a front edge of said at least one interior divider is located in front of the front edge of said at least one local slot.

8. The package according to claim 4, wherein said at least one interior divider comprises a glue bead extending over the front face of the support plate and extending from a squashed glue bead which fixes the end edge on the peripheral area of the support plate.

9. The package according to claim 1, wherein said at least one electronic chip is provided, on the front face thereof, with at least one optical sensor, the front wall of the cover having at least one through-hole and being provided with an optical element filling said at least one through-hole and transmitting light.

10. The package according to claim 1, wherein said at least one electronic chip is provided, on the front face thereof, with two optical sensors, said cover being provided with a separating internal partition defining two cavities in said chamber, inside which said two optical sensors are located; and
   further comprising a further electronic chip provided with a light radiation emitter placed in one of said two cavities; and
   wherein said front wall of the cover has through-holes located on either side of the internal partition and is provided with optical elements filling the through-holes, respectively, and transmitting light.

11. A package, comprising:
   a support plate having a front face;
   a local slot having an internal end and an external end;
   an electronic chip mounted on the front face of the support plate;
   a bead of glue that peripherally surrounds the electronic chip, said bead of glue including a squashed portion and an un-squashed portion;
   a cover which encapsulates the electronic chip, said cover comprising a front wall extending in front of the electronic chip and a peripheral wall having an end edge fixed to the front face of the support plate via the squashed portion of the bead of glue, said peripheral wall passing over said local slot at a position between the internal end and the external end of the local slot; and
   wherein the un-squashed portion of the bead of glue is positioned between an edge of the electronic chip and the internal end of the local slot.

12. The package of claim 11, wherein said local slot defines an air vent between an interior of the cover and an exterior.

13. The package of claim 11, wherein the local slot is located in the front face of the support plate.

14. The package of claim 11, wherein the local slot is located in the end edge of the peripheral wall.

15. A package, comprising:
   a support plate having a front face;
   at least one electronic chip mounted on the front face of the support plate;
   a cover which encapsulates the at least one electronic chip, said cover comprising a front wall extending in front of the at least one electronic chip and a peripheral wall having an end edge fixed on a peripheral area of the support plate, wherein the support plate and the cover define a chamber in which the at least one electronic chip is located; and
   a local slot arranged between the peripheral wall of the cover and the support plate and having an exterior opening and an interior opening leading into said chamber, said local slot connecting said chamber and an exterior, wherein said local slot includes a local groove arranged in the end edge of the peripheral wall of the cover;
   an interior divider located between the at least one electronic chip and the interior opening of said local slot; and a fixing glue bead inserted between the end edge of the peripheral wall of the cover and said peripheral area of the support plate, wherein the fixing glue bead has a local break including said local slot.

16. The package according to claim 15, wherein said local slot includes a local groove arranged in the front face of the support plate.

17. The package according to claim 15, wherein said interior divider projects from the front face of the support plate.

18. The package according to claim 15, wherein said interior divider has ends attached at two spaced-apart sites of the peripheral wall of the cover, these two spaced-apart sites being located on either side of said local slot.

19. The package according to claim 15, wherein a front edge of said interior divider is located in front of the front edge of said local slot.

20. The package according to claim 15, wherein said interior divider comprises a glue bead extending over the front face of the support plate and extending from a squashed glue bead which fixes the end edge on the peripheral area of the support plate.

21. The package according to claim 15, wherein said at least one electronic chip is provided, on the front face thereof, with at least one optical sensor, the front wall of the cover having at least one through-hole and being provided with an optical element filling said at least one through-hole and transmitting light.

22. The package according to claim 15, wherein said at least one electronic chip is provided, on the front face thereof, with two optical sensors, said cover being provided with a separating internal partition defining two cavities in said chamber, inside which said two optical sensors are located; and
   further comprising a further electronic chip provided with a light radiation emitter placed in one of said two cavities; and
   wherein said front wall of the cover has through-holes located on either side of the internal partition and is provided with optical elements filling the through-holes, respectively, and transmitting light.

23. A package, comprising:
   a support plate having a front face;
   at least one electronic chip mounted on the front face of the support plate;
   a cover which encapsulates the at least one electronic chip, said cover comprising a front wall extending in front of the at least one electronic chip and a peripheral wall having an end edge fixed on a peripheral area of the support plate, wherein the support plate and the cover define a chamber in which the at least one electronic chip is located; and
   at least one local slot arranged between the peripheral wall of the cover and the support plate and having an exterior opening and an interior opening leading into said chamber, said at least one local slot connecting said chamber and an exterior;
   wherein said at least one local slot includes a local groove arranged in the front face of the support plate.

24. The package according to claim 23, wherein said at least one local slot includes a further local groove arranged in the end edge of the peripheral wall of the cover.

25. The package according to claim 23, further comprising at least one interior divider located between the at least one electronic chip and the interior opening of said at least one local slot.

26. The package according to claim 25, wherein said at least one interior divider projects from the front face of the support plate.

27. The package according to claim 25, wherein said at least one interior divider has ends attached at two spaced-apart sites of the peripheral wall of the cover, these two spaced-apart sites being located on either side of said at least one local slot.

28. The package according to claim 25, wherein a front edge of said at least one interior divider is located in front of the front edge of said at least one local slot.

29. The package according to claim 25, wherein said at least one interior divider comprises a glue bead extending over the front face of the support plate and extending from a squashed glue bead which fixes the end edge on the peripheral area of the support plate.

30. The package according to claim 23, wherein said at least one electronic chip is provided, on the front face thereof, with at least one optical sensor, the front wall of the cover having at least one through-hole and being provided with an optical element filling said at least one through-hole and transmitting light.

31. The package according to claim 23, wherein said at least one electronic chip is provided, on the front face thereof, with two optical sensors, said cover being provided with a separating internal partition defining two cavities in said chamber, inside which said two optical sensors are located; and
   further comprising a further electronic chip provided with a light radiation emitter placed in one of said two cavities; and
   wherein said front wall of the cover has through-holes located on either side of the internal partition and is provided with optical elements filling the through-holes, respectively, and transmitting light.

32. A package, comprising:
   a support plate having a front face;
   at least one electronic chip mounted on the front face of the support plate;
   a cover which encapsulates the at least one electronic chip, said cover comprising a front wall extending in front of the at least one electronic chip and a peripheral wall having an end edge fixed on a peripheral area of the support plate, wherein the support plate and the cover define a chamber in which the at least one electronic chip is located; and
   a local slot arranged between the peripheral wall of the cover and the support plate and having an exterior opening and an interior opening leading into said chamber, said local slot connecting said chamber and an exterior, wherein said local slot includes a local groove arranged in the end edge of the peripheral wall of the cover and in the front face of the support plate; and
   an interior divider located between the at least one electronic chip and the interior opening of said local slot.

33. The package according to claim 32, wherein said interior divider projects from the front face of the support plate.

34. The package according to claim 32, wherein said interior divider has ends attached at two spaced-apart sites of the peripheral wall of the cover, these two spaced-apart sites being located on either side of said local slot.

35. The package according to claim 32, wherein a front edge of said interior divider is located in front of the front edge of said local slot.

36. The package according to claim 32, wherein said interior divider comprises a glue bead extending over the front face of the support plate and extending from a squashed glue bead which fixes the end edge on the peripheral area of the support plate.

37. The package according to claim 32, wherein said at least one electronic chip is provided, on the front face thereof, with at least one optical sensor, the front wall of the cover having at least one through-hole and being provided with an optical element filling said at least one through-hole and transmitting light.

38. The package according to claim 32, wherein said at least one electronic chip is provided, on the front face thereof, with two optical sensors, said cover being provided with a separating internal partition defining two cavities in said chamber, inside which said two optical sensors are located; and further comprising a further electronic chip provided with a light radiation emitter placed in one of said two cavities; and wherein said front wall of the cover has through-holes located on either side of the internal partition and is provided with optical elements filling the through-holes, respectively, and transmitting light.

* * * * *